United States Patent [19]
Nakatani et al.

[11] Patent Number: 5,252,519
[45] Date of Patent: Oct. 12, 1993

[54] MULTILAYERED CERAMIC SUBSTRATE AND METHOD OF MANUFACTURING THE SAME

[75] Inventors: Seiichi Nakatani, Hirakata; Tsutomu Nishimura, Uji; Satoru Yuhaku, Osaka; Yasuhiko Hakotani, Nishinomiya, all of Japan

[73] Assignee: Matsushita Electric Industrial Co., Ltd., Osaka, Japan

[21] Appl. No.: 785,750

[22] Filed: Oct. 31, 1991

[30] Foreign Application Priority Data
Nov. 1, 1990 [JP] Japan .................. 2-297969

[51] Int. Cl.$^5$ ............................ H01L 21/60
[52] U.S. Cl. .................. 437/209; 437/184; 437/189; 437/211; 252/518
[58] Field of Search ............ 437/209, 189, 184, 211; 106/1.18, 1.23, 1.26; 252/518, 514, 519

[56] References Cited
U.S. PATENT DOCUMENTS

| | | |
|---|---|---|
| 3,969,570 | 7/1976 | Smith ................... 252/514 |
| 4,004,057 | 1/1977 | Hoffman et al. ............ 252/514 |
| 4,793,946 | 12/1988 | Hsu ..................... 106/1.18 |
| 4,795,512 | 1/1989 | Nakatani et al. |
| 4,863,683 | 9/1989 | Nakatani et al. .......... 252/518 |
| 4,865,772 | 9/1989 | Suehiro et al. ........... 252/518 |
| 4,877,555 | 10/1989 | Yuhaku et al. ........... 106/1.23 |
| 4,906,404 | 3/1990 | Suehiro et al. ........... 106/1.23 |

Primary Examiner—Brian E. Hearn
Assistant Examiner—Kevin M. Picardat
Attorney, Agent, or Firm—Wenderoth, Lind & Ponack

[57] ABSTRACT

A multilayered glass-ceramic substrate using copper as wiring material is fabricated by a step of forming wiring patterns with Au paste for connection of semiconductor chip prepared by adding at least one of Ni powder, Pt powder and Pd powder to Au powder, and copper oxide paste mainly composed of CuO powder, on a green sheet, and burning out the organic pattern by heat treatment in air, a step of reducing the copper oxide electrode by heat treatment in a reducing atmosphere containing hydrogen, and a step of sintering the substrate material, copper oxide electrode and gold electrode by heat treatment in nitrogen. Since the Au wiring pattern is formed on the top layer of the multilayered substrate in this constitution, wire bonding of high reliability is realized. Besides, by making use of the excellent solderability of Au, it may be also applied in flip-chip mounting of semiconductor. In addition, in this Au paste composition, the melting point of Au may be raised, and alloying or fusing is avoided if sintered at 900° C. together with Cu electrode.

4 Claims, 3 Drawing Sheets

MULTILAYERED CERAMIC SUBSTRATE AND METHOD OF MANUFACTURING THE SAME

BACKGROUND OF THE INVENTION

1. Field of the Invention

The present invention relates to a multilayered ceramic substrate for mounting thereon and interconnecting LSI and chip components, and a method of manufacturing the same.

2. Description of the Prior Art

Conductor materials used for multilayered substrate include noble metals such as Au, Pt and Pd, and base metals such as W, Mo and Cu. On this metal material, an organic binder and a solvent are added to form into a paste, which is screen-printed on a dielectric substrate made of alumina or the like, and fired, thereby forming a conductor pattern. To manufacture a multilayered substrate, other methods are also known, such as a multilayering method by using, aside from these conductor pastes, ceramics and glass powder as insulating materials which are diffused in a solvent containing a dissolved organic binder, and a multilayering method by laminating formed patterns of conductor paste on a green sheet made of such insulating powder, organic binder and others. As for the metal conductor materials used in them, Au and Ag/Pd can be sintered in air, but they are noble metals and are expensive. On the other hand, W, Mo and Cu are base metals and inexpensive, but they must be sintered in a reducing atmosphere or inert atmosphere. Besides, W and Mo require a high sintering temperature of 1500° C. or more. From the viewpoint of reliability, Au has a problem in solder leaching, and Ag/Pd is high in migration and conductor resistance. Accordingly, Cu is being noticed lately because it is low in conductor resistance, small in migration, and favorable in solderability.

To use such Cu, however, it is necessary as mentioned above to sinter in an inert atmosphere such as nitrogen. In nitrogen atmosphere, it is difficult to decompose and remove the organic binder in the paste. This is because the oxygen partial pressure in the nitrogen atmosphere is low, and decomposition of the binder does not occur, and it is left over in a form of carbon, which adversely affects the metallizing performance (sheet resistance, solderability, adhesion strength). To the contrary, where the oxygen partial pressure in the firing atmosphere during the firing step is high, the copper electrode is oxidized and the soldering performance becomes worse. In sintering, accordingly, it is required to control the oxygen slightly in nitrogen atmosphere. The same problems occur in the laminate using a green sheet such as multilayered ceramic capacitor.

That is, it is difficult to burn out the organic binder contained in the green sheet such as dielectric, and unless burnt out completely, the binder is left over in a carbonized state, which may induce blister between layers or worsen the matching of electrode and dielectric. A method to solve the contradictory problems of binder burn-out and Cu metallizing was proposed. This is a method of using copper oxide as a starting material of electrode, and according to this method, heat treatment is preliminarily conducted in the air in order to burn out the organic components contained in the paste, and then the copper oxide is reduced to obtain a metal copper, and then sintering is performed in nitrogen atmosphere. This method is ideal for obtaining a laminate of Cu electrode because of the complete removal of the organic components in the first place to be followed by reducing and sintering steps. This multilayering method by copper oxide is disclosed in U.S. Pat. No. 4,714,570, and the copper oxide paste is mentioned in U.S. Pat. No. 4,906,405.

In such constitution, on the other hand, the following problems to be solved are found out. That is, in such multilayered ceramic substrate, it is difficult to apply wire bonding directly on the top layer Cu electrode. The wire bonding on the Cu electrode involves many reliability problems at the present, which is because the Cu multilayered ceramic substrate is not used widely.

It has been therefore attempted to apply Au plating on the top layer Cu electrode, but the adhesion strength of Cu electrode is extremely lowered due to the effect of plating solution. On the other hand, when forming an Au electrode by other method than plating, since the inside of the multilayered substrate and the top layer printed pattern are both Cu electrodes, and in order to print and sinter the thick film Au paste, it is necessary to sinter in nitrogen in order to prevent oxidation of Cu. It, in turn, leads to problems in the solderability and adhesion strength of Au electrode. Besides, connection of Cu and Au cannot be treated at so high temperature because the junction is lowered in melting point due to the reaction of Au and Cu.

In the existing method, moreover, it is general to sinter the internal electrode and substrate material simultaneously, and then apply the top layer Cu printed pattern. In this case, therefore, the sintering shrinkage of the substrate is not uniform, but is variable depending on the lot fluctuations of the substrate materials or sintering condition, and hence it is necessary to use a land for connection, considering the allowance for fluctuations of the shrinkage rate, for connection of the top layer pattern and the inner layer pattern.

As a result, a wider land than necessary is present on the top layer pattern, which is an obstacle for higher density mounting.

SUMMARY OF THE INVENTION

It is hence a primary object of the invention to obtain an Au printed pattern necessary for wire bonding and mounting of a flip chip on the top layer printed pattern, for fabrication of copper multilayered ceramic substrate.

It is another object to present a method for manufacturing a multilayered copper ceramic substrate excellent in matching with ceramic materials and capable of being formed at high reliability.

To solve the above problems, a copper multilayered ceramic substrate of the invention is fabricated by a method comprising a step of forming a printed pattern for connection with Au thick film paste for connection of semiconductor chip by adding at least a solvent and an organic binder to an inorganic composition containing at least one of Ni powder, Pt powder and Pd power by 0.5 to 1.0 wt. % and 90.0 to 99.5 wt. % of Au powder, on a green sheet composed of glass-ceramic mixed powder, thereby forming a printed pattern with a copper oxide paste composed of an inorganic composition mainly made of CuO powder, and an organic vehicle composition made of at least an organic binder and a solvent, and burning out the organic binder by heat treatment in the air, a step of reducing the copper oxide electrode by heat treatment in a reducing atmosphere containing hydrogen, and a step of sintering the substrate material, copper and gold electrode by heat treatment in nitrogen.

In this constitution, the Au printed pattern is formed on the top layer of the multilayered substrate, and hence wire bonding of high reliability is realized. Besides, by making use of the excellent solderability of Au, it may be also applied in mounting of flip chip of semiconductor. Moreover, in this Au paste composition, the melting point of Au may be raised, and if it is sintered simultaneously with the Cu electrode at 900° C., alloying or fusion may be avoided.

Furthermore, when the multilayered substrate is fabricated in the manufacturing method comprising the steps above, the thick film Au paste may be sintered simultaneously with the Cu electrodes of the inner and outer layers without sintering in nitrogen, so that the binder may be burnt out smoothly, thereby obtaining a highly reliable multilayered substrate. Still more, since the electrode patterns are obtained by simultaneous sintering, it is not necessary to take into consideration the shrinkage rate in sintering, and the land for connection may be as small as possible.

The above constitution also makes it possible to mount a highly reliable semiconductor. As the method for electrically connecting a bare semiconductor chip on a substrate on which conductor patterns are formed, bumps may be formed on the semiconductor pads of the semiconductor chip by plating technique, or bumps may be formed by wire bonding method. Consequently, by using adhesive conductor paste or solder paste, the semiconductor chip may be easily connected to the substrate facedown. That is, the bumps are formed either by plating or by wire bonding, and then flattened. Next, a conductive epoxy resin is transferred to the Au bumps to connect the semiconductor chip to the substrate, or the semiconductor chip is connected in the solder paste printed area on the Au printed pattern.

Meanwhile, as a method of electrically connecting a bare semiconductor chip to the substrate on which conductor patterns are formed, the semiconductor chip is connected to the substrate by the wire bonding method. This is a method of connecting to the electrode pads of the semiconductor chip and a part of the Au printed pattern with Au wires, which is widely employed in hybrid ICs and others. The method of connecting facedown is advantageous for downsizing because the mounting area may be smaller.

DESCRIPTION OF THE PREFERRED EMBODIMENTS

Figure 1:
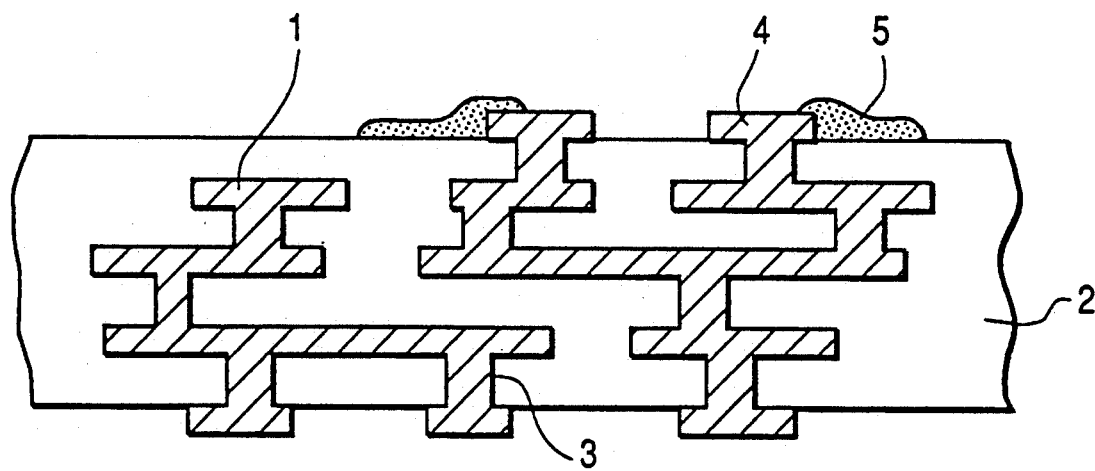
FIG. 1 is a sectional view of Cu multilayered ceramic substrate in a first embodiment of the invention.

Referring now to the drawings, a multilayered ceramic substrate in an embodiment of the invention is described in detail below. FIG. 1 is a sectional view showing a typical example of a multilayered ceramic substrate in a first embodiment of the invention. In FIG. 1, numeral 1 denotes an internal Cu electrode, 2 is a ceramic substrate layer, 3 is a via hole Cu electrode layer, 4 is a top layer Cu electrode, and 5 is an Au electrode layer.

Materials used in the multilayered ceramic substrate of the invention are lead borosilicate glass (COG-22 by Nippon Electric Glass Co.) as the glass composition and alumina powder (ALM-41 by Sumitomo Aluminum Co.) as the ceramic composition, which were mixed 50:50 by weight. This substrate material powder as inorganic composition was mixed with polyvinyl butyral (PVB) as an organic binder, di-n-butyl phthalate (DBP) as a plasticizer, and a mixed solution of toluene and isopropyl alcohol (30:70 by weight) as a solvent, in the composition as shown in Table 1 to obtain a slurry.

TABLE 1

| Dielectric composition, green sheet composition | |
|---|---|
| Substrate material composition | 100 wt. % |
| Organic binder PVB | 12 wt. % |
| Plasticizer DBP | 5 wt. % |
| Solvent Toluene/ethanol 7/3 | 50 wt. % |

After sufficiently mixing this slurry, it was spread on an organic film by doctor blading method to form a green sheet. The film thickness after drying was about 200 μm. In this green sheet, via holes were punched as required by using a die. The via hole diameter was 0.2 mmφ.

A method for manufacturing a conductive paste for inner layer is described below. To cupric oxide powder (mean particle size 3 μm), glass frit (GA-1 by Nippon Electric Glass Co., mean particle size 2 μm) was added by 3 wt. % in order to achieve an adhesion strength to obtain an inorganic composition. Next, ethyl cellulose as an organic binder was dissolved in α-terpineol to prepare a vehicle composition, in which the organic composition was dispersed to obtain a paste mixture.

The conductive paste for via filling was prepared by adding alumina powder ($A_2O_3$, ALM=41 by Sumitomo Aluminum Co., mean particle size about 1.9 μm) by 15 wt. % to the inorganic composition of the conductive paste for inner layer. The procedure of preparing the paste is same as that of the paste for inner layer. Addition of alumina powder is intended to adjust the volume shrinkage when sintering the substrate with that of the substrate. As the conductive paste for the top layer, the same inorganic composition as in the conductive paste for inner layer was used.

The inorganic composition of Au paste for simultaneous sintering is shown in Table 2.

TABLE 2

| | Au paste composition | | | | |
|---|---|---|---|---|---|
| No. | Au | Ni | Pt | Pd | Glass |
| 1 | 96.9 | 0.1 | — | — | 3 |
| 2 | 96.5 | 0.5 | — | — | 3 |
| 3 | 94 | 3 | — | — | 3 |
| 4 | 87 | 10 | — | — | 3 |
| 5 | 82 | 15 | — | — | 3 |
| 6 | 96.9 | — | 0.1 | — | 3 |
| 7 | 96.5 | — | 0.5 | — | 3 |
| 8 | 94 | — | 3 | — | 3 |
| 9 | 87 | — | 10 | — | 3 |
| 10 | 82 | — | 15 | — | 3 |
| 11 | 96.9 | — | — | 0.1 | 3 |
| 12 | 96.5 | — | — | 0.5 | 3 |
| 13 | 94 | — | — | 3 | 3 |
| 14 | 87 | — | — | 10 | 3 |
| 15 | 82 | — | — | 15 | 3 |

The method of preparing the conductive Au paste of the invention is to add ethyl cellulose as organic binder to the inorganic powder of the above composition together with the vehicle dissolved in α-terpineol, and to knead until reaching an adequate viscosity by three roll mill.

Figure 2:
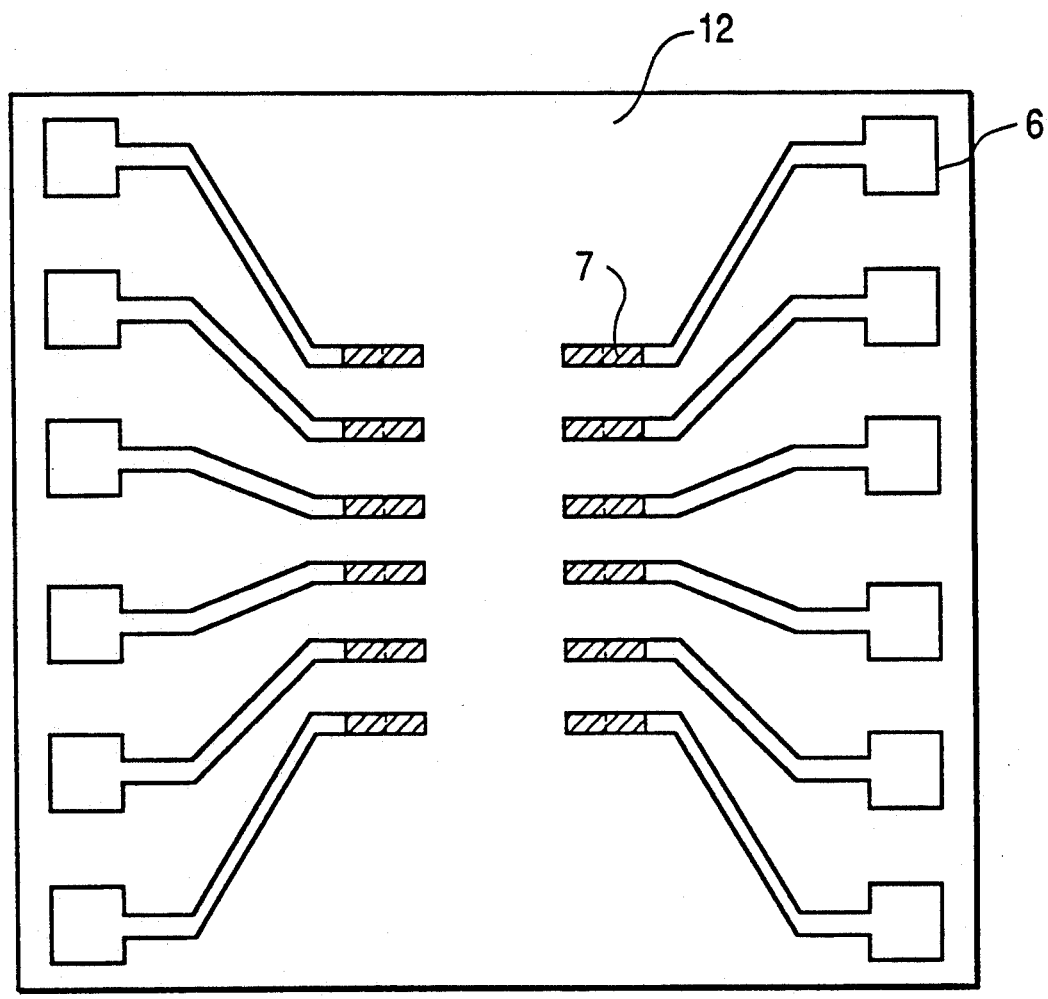
FIG. 2 is a diagram showing the top layer printed pattern in an embodiment of the invention.

Using thus obtained conductive paste, first via hole filling print is done. In the printing method, the green sheet in which via holes were formed (already punched) is squeezed by using a metal mask for via filling by screen printing method, thereby filling, printing and drying the via holes. On the green sheet after via filling and printing, the conductive paste for inner layer is formed by screen printing. Similarly, in other green sheet, via filling and inner layer pattern forming are effected. After drying the green sheet on which the conductive pattern for inner layer has been formed, a specified number of layers are laminated by applying heat and pressure. Consequently, using the top layer CuO conductive paste and Au paste, the pattern as shown in FIG. 2 is formed by screen printing method. In FIG. 2, numeral 12 is the laminated green sheet, 6 is the top layer CuO conductive pattern, and 7 is the Au pattern.

At this time, either the top layer conductive paste or the Au paste may be printed first. Thus obtained laminate was cut to a specified size, and the binder was burnt out by heat treatment in the air for 30 minutes. The binder burnout temperature was 600° C. Next, in the reducing step, reduction was conducted while holding in the nitrogen atmosphere containing 10% of hydrogen for 1 hour at 450° C. Finally, in the nitrogen atmosphere, sintering was performed for 10 minutes (in-out 60 minutes). The sintering temperature was 900° C. These heat treatments were done automatically in a mesh belt type furnace.

The results of the performance of the top layer printed pattern of thus fabricated multilayered ceramic substrate are summarized in Table 3.

TABLE 3

| | Performance of top layer printed pattern | | |
|---|---|---|---|
| No. | Bonding state of Cu and Au | Au conductor sheet resistance | Wire bonding performance |
| 1 | Δ | 4.51 m | Excellent |
| 2 | Δ | 5.41 | Excellent |
| 3 | ○ | 7.36 | Good |
| 4 | ⊚ | 12.55 | Good |
| 5 | ⊚ | 25.22 | Bad |
| 6 | x | 6.31 | Excellent |
| 7 | Δ | 7.77 | Good |
| 8 | ⊚ | 9.55 | Good |
| 9 | ○ | 10.10 | Bad |
| 10 | ○ | 12.36 | Bad |
| 11 | Δ | 4.03 | Excellent |
| 12 | ○ | 3.83 | Excellent |
| 13 | ⊚ | 5.71 | Good |
| 14 | ⊚ | 7.12 | Good |
| 15 | ○ | 11.22 | Bad |

Meanwhile, bonding of Au and Cu was evaluated by visually judging the state of the conductor after sintering. When Cu and Au were alloyed and fused, it was marked with an x; when diffusion was extreme and the reliability was insufficient, a triangle was given; a circle means a good bond; and a double circle is for a particularly excellent bond. Practically, circle or double circle evaluation should be preferred. As clear from Table 3, when each additive was 0.5% or more, the melting point of Au could be definitely raised, and a favorable bond with Cu was obtained.

Besides, considering from the results of the sheet resistance and wire bonding performance of the obtained Au electrode, it is known that wire bonding is difficult on the Au electrode when each additive was contained by 10 wt. % or more. This seems because the hardness of the Au electrode is increased by adding additives to Au and the wire cannot be connected by ultrasonic waves. Considering from these results, the optimum content of each additive is preferable about 1 to 3 wt. %.

Next, the semiconductor chip was mounted on the sintered substrate by flip chip mounting.

Figure 3:
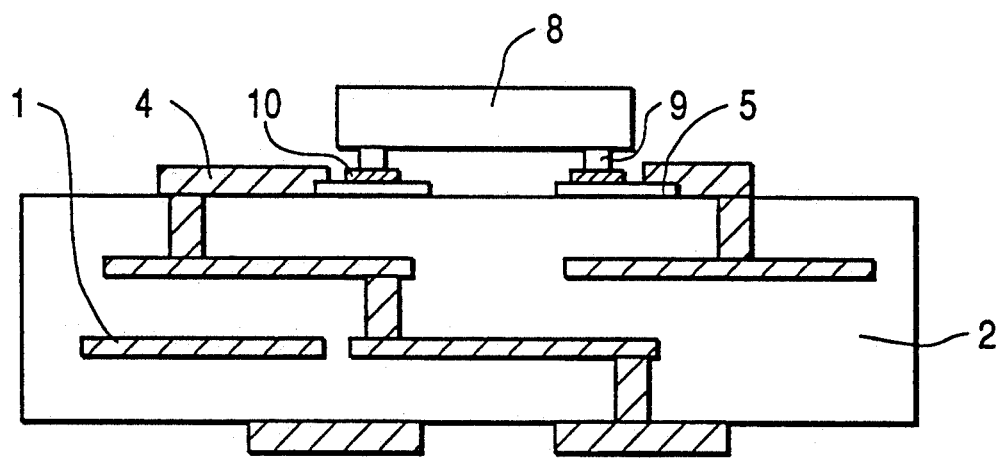
FIG. 3 is a sectional view of mounting a flip chip of a semiconductor chip in an embodiment of the invention.

A sectional view of an example of mounting of semiconductor chip by the invention is shown in FIG. 3.

Mounting on the substrate on which Au conductive patterns were formed was conducted in the following method. First using a wire bonding device, a ball is formed on the tip of the Au wire (diameter 25 μm) by heat energy. The ball is press-fitted to the electrode pad of the semiconductor chip 8 by means of the capillary of the bonder, and the capillary is moved along a loop track, and by cutting off the Au wire, a bump (Au bump) 9 is formed. The substrate having a flat surface is pressed against the bump 9 of the semiconductor chip 8, and the bump 9 is flattened. The flattened bump is put on a separately prepared supporting substrate, and a an adhesive conductor paste composed of a mixture of alloy powder of Ag/Pd powder (mixing ratio 80/20 wt. %) and a solution (butyl carbitol acetate) having an organic binder (epoxy resin) dissolved in an organic solvent is applied to a uniform thickness. Matching with the coated surface, the adhesive conductor paste is transferred only on the bump. The semiconductor chip is mounted on a desired position of the substrate on which the Au conductor patterns are formed. The substrate mounting the semiconductor chip is heated for 2 hours at 120° C.

In the drawing, numeral 4 is the top layer Cu electrode, 5 is an Au electrode for connecting the semiconductor chip 8, 9 is an Au bump, and 10 is an adhesive conductor paste layer.

In this embodiment, Ag/Pd conductive paste was used in mounting, but, needless to say, the semiconductor device may be mounted by using solder paste and applying a solder coat on a specified position of the substrate preliminarily. In this case, by making use of the advantage of the excellent solderability of Au, it may be applied in flip-chip mounting of semiconductor. Moreover, by this Au paste composition, the melting point of Au may be raised, and if sintered at 900° C. simultaneously with Cu electrode, alloying or fusing does not occur, and it is possible to sinter simultaneously with Cu electrodes of inner and outer layers, and the binder may be burnt out smoothly, and a highly reliable multilayered substrate may be obtained. In addition, since the electrode patterns are obtained by sintering simultaneously, it is not necessary to take into consideration the shrinkage rate in sintering, so that the land for connection may be reduced in size as much as possible.

What is claimed is:

1. A method of manufacturing a multilayered ceramic substrate comprising the steps of:
    preparing a CuO paste comprising an inorganic component which comprises CuO powder, and an organic vehicle which comprises an organic binder and a solvent;

preparing an Au paste comprising an inorganic component which comprises 90.0 to 99.5 wt. % of Au powder and 0.5 to 10.0 wt. % of at least one of Ni powder, Pt powder and Pd powder, and an organic vehicle which comprises an organic binder and a solvent;

preparing a plurality of glass-ceramic green sheets each having via holes;

forming a pattern of said CuO paste on a surface of each of the plurality of glass-ceramic green sheets and a pattern of said Au paste on a surface of one glass-ceramic green sheet among the plurality of glass-ceramic green sheets such that the pattern of said Au paste is in contact with a part of the pattern of said CuO paste on said surface of said one glass-ceramic green sheet and filling the via holes of the plurality of glass-ceramic green sheets with said CuO paste;

laminating the plurality of glass-ceramic green sheets having formed thereon the patterns of said CuO paste and said Au paste so as to form a multilayer body such that said surface having formed thereon both the patterns of said Au paste and the pattern of said CuO paste becomes an outermost surface of said multilayer body;

heating said multilayer body in air so as to burn out the organic binder in each of said CuO paste and said Au paste;

heat treating said multilayer body in a reducing atmosphere containing hydrogen so as to reduce CuO in said CuO paste to a metal Cu; and sintering said multilayer body in nitrogen to thereby form a multilayered ceramic substrate having inner Cu electrode patterns and on its outermost surface a Cu electrode pattern and an Au electrode pattern which is in contact with a part of the Cu electrode pattern.

2. The method according to claim 1, further comprising a step of mounting a semiconductor chip on said Au electrode pattern by a wire bonding method.

3. The method according to claim 1, further comprising a step of mounting a semiconductor ship on said Au electrode pattern by a flip-chip mounting method.

4. The method according to claim 1, wherein said Au paste further comprises at least one of metal oxide powder and glass powder.

* * * * *